(12) United States Patent
Lu et al.

(10) Patent No.: US 9,618,837 B2
(45) Date of Patent: Apr. 11, 2017

(54) EXTREME ULTRAVIOLET LITHOGRAPHY PROCESS AND MASK WITH REDUCED SHADOW EFFECT AND ENHANCED INTENSITY

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/345,218

(22) Filed: Nov. 7, 2016

(65) Prior Publication Data

US 2017/0052441 A1     Feb. 23, 2017

Related U.S. Application Data

(60) Continuation of application No. 15/044,003, filed on Feb. 15, 2016, now Pat. No. 9,488,905, which is a division of application No. 14/221,555, filed on Mar. 21, 2014, now Pat. No. 9,261,774.

(60) Provisional application No. 61/907,882, filed on Nov. 22, 2013.

(51) Int. Cl.
*G03F 1/24* (2012.01)
*G03F 1/22* (2012.01)
*G03F 1/36* (2012.01)
*G03F 1/76* (2012.01)

(52) U.S. Cl.
CPC .............. *G03F 1/24* (2013.01); *G03F 1/22* (2013.01); *G03F 1/36* (2013.01); *G03F 1/76* (2013.01)

(58) Field of Classification Search
CPC ..... G03F 1/22; G03F 1/24; G03F 1/36; G03F 1/76
USPC .......................................................... 430/5
See application file for complete search history.

(56) References Cited

U.S. PATENT DOCUMENTS

| 6,641,959 | B2 * | 11/2003 | Yan | B82Y 10/00 430/5 |
| 8,628,897 | B1 * | 1/2014 | Lu | G03F 1/24 430/5 |
| 8,679,707 | B2 * | 3/2014 | Lee | G03F 1/22 430/5 |
| 8,691,476 | B2 * | 4/2014 | Yu | G03F 1/24 430/5 |
| 8,709,682 | B2 * | 4/2014 | Chen | G03F 1/42 382/144 |
| 8,715,890 | B2 * | 5/2014 | Tu | H01L 21/31 257/673 |
| 8,722,286 | B2 * | 5/2014 | Yu | H01J 37/3175 430/296 |
| 8,753,788 | B1 * | 6/2014 | Yu | G03F 1/72 356/237.4 |
| 8,764,995 | B2 * | 7/2014 | Chang | G03F 1/58 216/12 |
| 8,765,330 | B2 * | 7/2014 | Shih | G03F 1/26 430/5 |
| 8,765,582 | B2 * | 7/2014 | Hsu | H01L 29/34 438/491 |
| 8,785,084 | B2 * | 7/2014 | Lu | G03F 1/72 430/5 |
| 8,828,625 | B2 * | 9/2014 | Lu | G03F 1/52 204/192.11 |
| 8,841,047 | B2 * | 9/2014 | Yu | G03F 1/24 430/311 |
| 8,877,409 | B2 * | 11/2014 | Hsu | G03F 1/24 430/5 |

* cited by examiner

*Primary Examiner* — Christopher Young
(74) *Attorney, Agent, or Firm* — Haynes and Boone, LLP

(57) ABSTRACT

An extreme ultraviolet (EUV) mask comprises a substrate, a first reflective layer above a surface of the substrate, and a second reflective layer over the first reflective layer. The second reflective layer has various openings that define a first state and a second state. The first state includes the first reflective layer and is free of the second reflective layer. The second state includes both the first and second reflective layers. The first state has a first reflection coefficient and a first reflectivity. The second state has a second reflection coefficient and a second reflectivity. A phase difference between the first and second reflection coefficients is about 180 degrees.

20 Claims, 8 Drawing Sheets

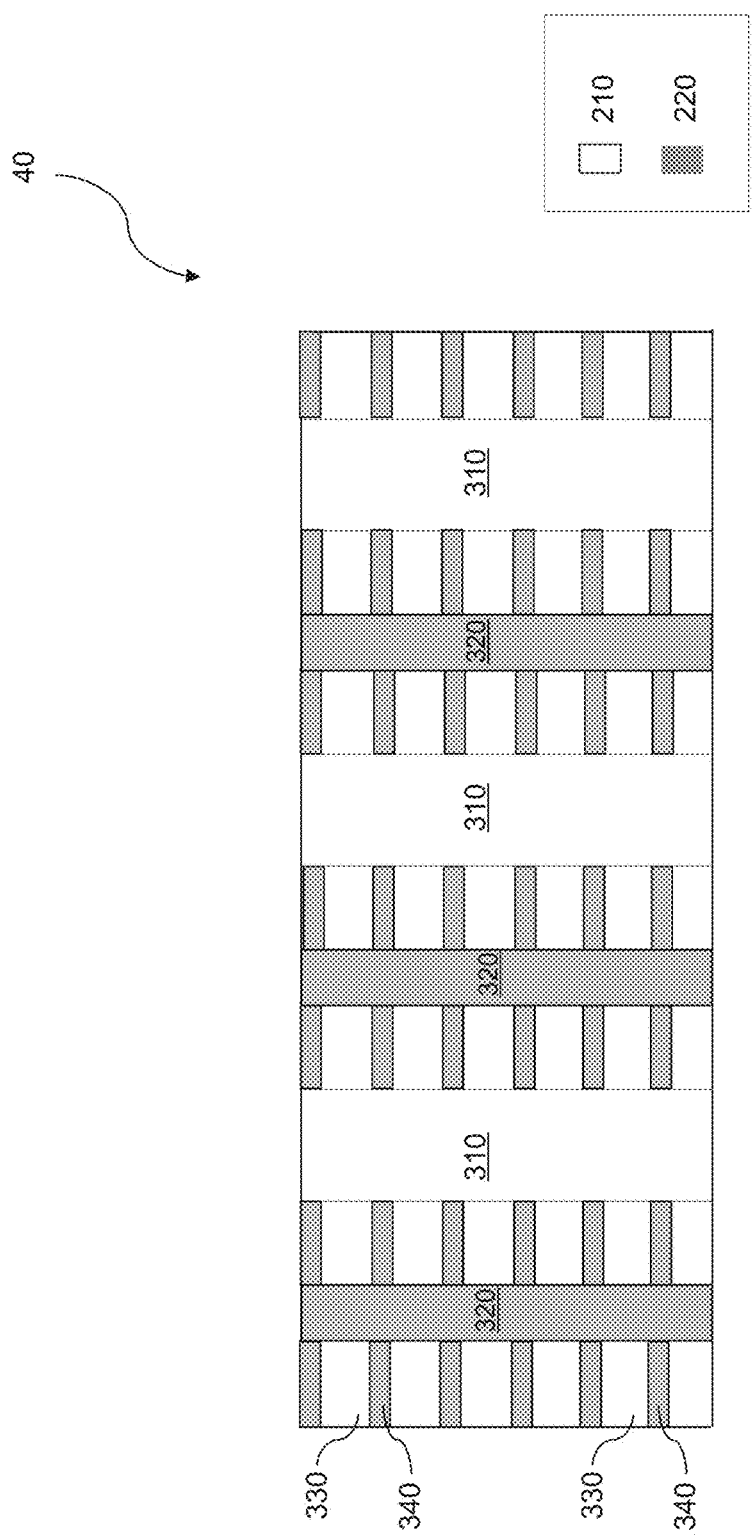

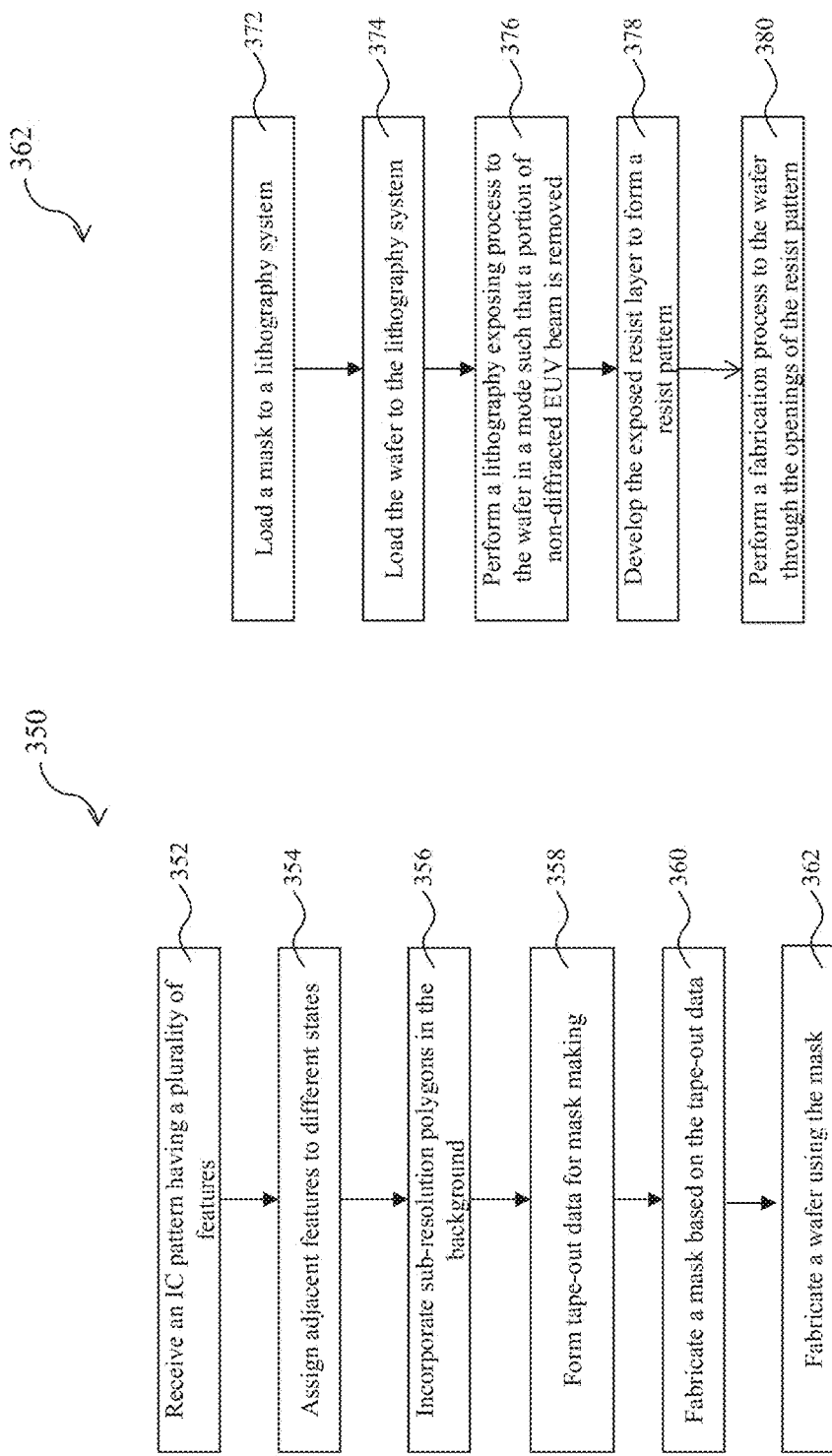

EXTREME ULTRAVIOLET LITHOGRAPHY PROCESS AND MASK WITH REDUCED SHADOW EFFECT AND ENHANCED INTENSITY

PRIORITY DATA

This is a continuation of U.S. application Ser. No. 15/044,003, filed Feb. 15, 2016, which is a divisional of U.S. application Ser. No. 14/221,555, filed Mar. 21, 2014, now issued U.S. Pat. No. 9,261,774, which claims the benefit of U.S. Prov. App. Ser. No. 61/907,882 filed Nov. 22, 2013. The entire disclosure of these applications is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has its limitation needed to be overcome. For example, for AltPSM, one of the methods to generate a phase-shifting region without much attenuation in reflectivity is to create a step of appropriate height on a substrate and then form a multilayer (ML) over the step. However, the ML tends to smooth out the step height, leading to a large transition area between phase-shifting and non-phase-shifting regions. This will limit the achievable resolution limit. Therefore, a mask structure and the method to make and use the same are desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a diagrammatic top view of a EUV mask according to aspects of the present disclosure in one or more embodiment.

FIG. 8 is a flowchart of a method for mask making constructed according to aspects of the present disclosure in one or more embodiment.

FIG. 9 is a flowchart of a lithography process constructed according to aspects of the present disclosure in one or more embodiment.

DETAILED DESCRIPTION

Figure 1:
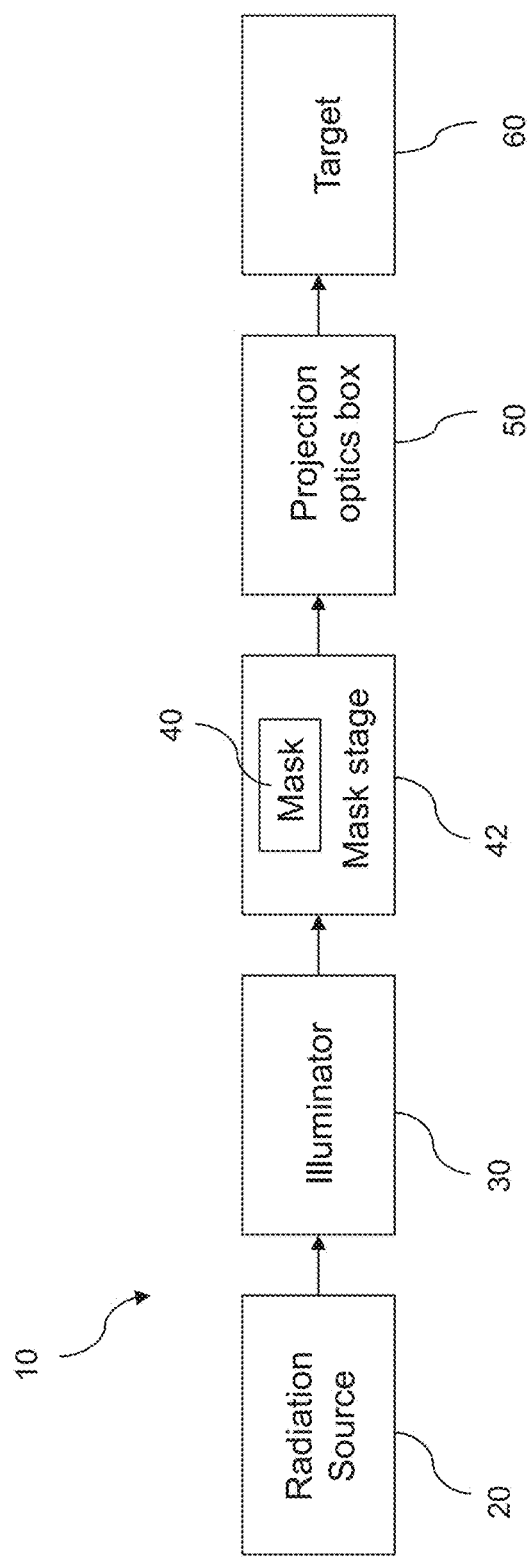
FIG. 1 is a block diagram of a lithography system for implementing a mask structure constructed according to aspects of the present disclosure in one or more embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an extreme ultraviolet (EUV) lithography system 10 that may benefit from one or more embodiments of the present disclosure is described in detail below. The method to implement an EUV lithography process with the EUV lithography system 10 and the system 10 are collectively described with reference to FIG. 1. The EUV lithography system 10 employs a radiation source 20 that generates EUV light with a wavelength in the range of 1-100 nanometers (nm).

The EUV lithography system 10 also employs an illuminator 30. The illuminator 30 may comprise refractive optics, such as a single lens or a lens system having multiple lenses (zone plates) or reflective optics, such as a single mirror or a mirror system having multiple mirrors in order to direct light from the radiation source 20 onto a mask 40. In the EUV wavelength range, nearly all condensed materials are highly absorbing and generally reflective optics consisting of multilayer mirrors (to be described later) is adopted. Refractive optics, however, can also be realized by, e.g., zoneplates. Refractive optics, realized by zone plates, is a low-cost solution mostly for low-end applications. In the present embodiment, the illuminator 30 is set up to provide an on-axis illumination (ONI) to illuminate the mask 40. In ONI, all incoming light rays incident on the mask at the same angle of incidence (AOI), e.g., AOI=6°, as that of the chief ray. In real situation, there may be some angular spread of the incident light. For example, if a disk illumination (i.e., the shape of the illumination on the pupil plane being like a disk centered at the pupil center) of a small partial coherence σ, e.g., σ=0.3, is employed, the maximum angular deviation from the chief ray is $\sin^{-1}$ [m×σ×NA], where m and NA are the magnification and numerical aperture, respectively, of the projection optics box (POB) 50 (to be detailed below) of the imaging system. In the case of off-axis illumination, partial coherence σ can also be used to describe a point source which produces a plane wave illuminating the mask 40. In this case, the distance from the pupil center to the point source in the pupil plane is NA×σ and the AOI of the corresponding plane wave incident on the mask 40 is $\sin^{-1}$ [m×σ×NA]. In the present embodiment, it is sufficient to employ a nearly ONI consists of point sources with σ less than 0.3. According to our experiments and evaluation, in EUVL, the conventional resolution enhancement technique (RET) using off-axis illumination (OAI) accompanied by 5% attenuated phase-shifting mask (AttPSM) cannot go beyond the technology node with the minimum pitch of 32 nm unless resist blur can be very small. This is the reason why ONI is used in this disclosure.

The EUV lithography system 10 also employs the mask 40 (also called photomask or reticle in the literature) secured on a mask stage 42. The mask 40 can be a transmissive mask or a reflective mask. In the present embodiment, the mask 40 is a reflective mask to be described in detail below.

In the present embodiment, the mask 40 includes a plurality of main polygons. Main polygons represent patterns of a layer of an IC design and will be imaged to the target 60. The background region without main polygon may be filled with sub-resolution assist polygons to fine tune the effective reflection coefficient of the background region. Sub-resolution assist polygons may include long rectangles. For example, for a regular array of same long rectangles with pitch p (p=w+s, w being the width of the short edge of a long rectangle and s being the space between two long rectangles), if p<λ/NA, then they will not print on the target 60. The region without main polygon and sub-resolution assist polygon is referred to as a field.

The EUV lithography system 10 also employs the POB 50. The POB 50 may have refractive optics or reflective optics. In the present embodiment, the POB 50 has reflective optics. The radiation reflected from the mask 40 (e.g., a patterned radiation) is collected by the POB 50. The radiation reflected from the mask 40 is diffracted into various diffraction orders, which are collected by the POB 50. The POB 50 may include a magnification of less than one (thereby the size of the "image" on the target 60 is smaller than the size of the corresponding "object" on the mask 40).

Figure 2:
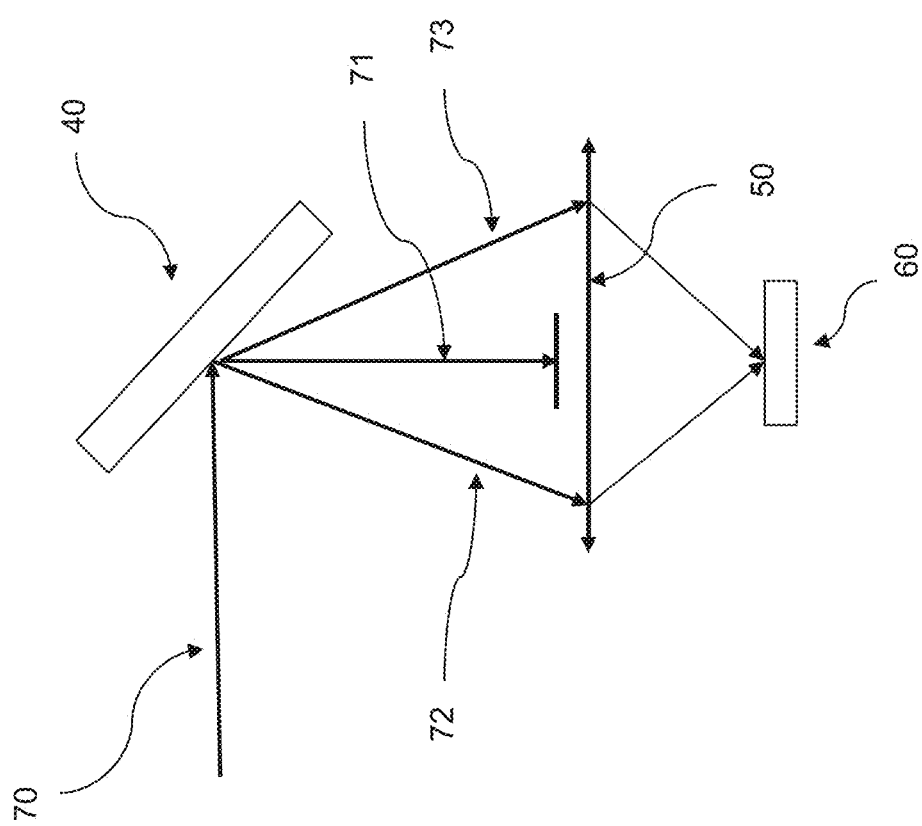
FIG. 2 is a diagrammatic perspective view of a projection optics box (POB) employed in the lithography process for implementing one or more embodiments of the present disclosure including the mask structure and the method utilizing the same. Since a POB by reflective optics is difficult to sketch, the equivalent refractive optics is used to illustrate the underlying principle.

A method for an EUV lithography process using the EUV lithography system 10 and the mask 40 is described according to one embodiment with reference to FIG. 2. In FIG. 2, an incident light ray 70, after being reflected from the mask 40, is diffracted into light rays of various diffraction orders due to presence of the polygons on the mask 40, such as a 0-th diffraction order light ray 71, a −1-st diffraction order light ray 72 and a +1-st diffraction order light ray 73. For lithographic imaging, purely coherent illumination is generally not employed. In the present embodiment, disk illumination with partial coherence σ at most 0.3 generated by the illuminator 30 is employed. This means that there are many light rays incident on the mask with their AOI's deviated from that of the chief ray by no larger than $\sin^{-1}$ [m×σ×NA] and each incident light ray will generate light rays of various diffraction orders. Then, the non-diffracted light rays 71 are mostly removed by, e.g., central obscuration in the pupil plane (in the real situation they are just not collected by the POB 50). The −1-st and +1-st diffraction order light rays, 72 and 73, are collected by the POB 50 and directed to expose the target 60. Since the strength of the −1-st and +1-st diffraction order light rays, 72 and 73, are balanced in strength, they interfere with each other and will generate a high contrast aerial image. Highest aerial image contrast can be achieved and the exposure latitude (EL) can be maximized. Since the −1-st and +1-st diffraction order light rays, 72 and 73, are of the same distance from the pupil center in the pupil plane, the depth of focus (DOF) is also maximized. For more isolated patterns, e.g., patterns of the contact layer, more diffraction orders can be collected under the same NA. In this case, one can use off-axis illumination (the 0-th diffraction order is still removed) to achieve an enhancement in resolution and an increase in the pupil filling ratio (the ratio of the illuminated area versus the total area of the pupil).

The target 60 includes a semiconductor wafer with a photosensitive layer (e.g., photoresist or resist), which is sensitive to the radiation beam, such as the EUV radiation in the present embodiment. The target 60 may be held by a target substrate stage of the lithography system 10. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two operations: a blank mask fabrication process and a mask patterning process. During the blank mask fabrication process, a blank mask is formed by depositing suitable layers (e.g., a reflective multilayer) on a suitable substrate. The blank mask is patterned during the mask patterning process to have a design of a layer of an integrated circuit (IC). The patterned mask is then used to transfer circuit patterns (e.g., the design of a layer of an IC)

onto a semiconductor wafer. The patterns on the mask can be transferred over and over onto multiple wafers through various lithography processes. Several masks (for example, a set of 15 to 30 masks) may be used to construct a complete IC. In general, various masks are fabricated for being used in various lithography processes. Types of EUV masks include binary intensity mask (BIM) and phase-shifting mask (PSM).

Figure 3:
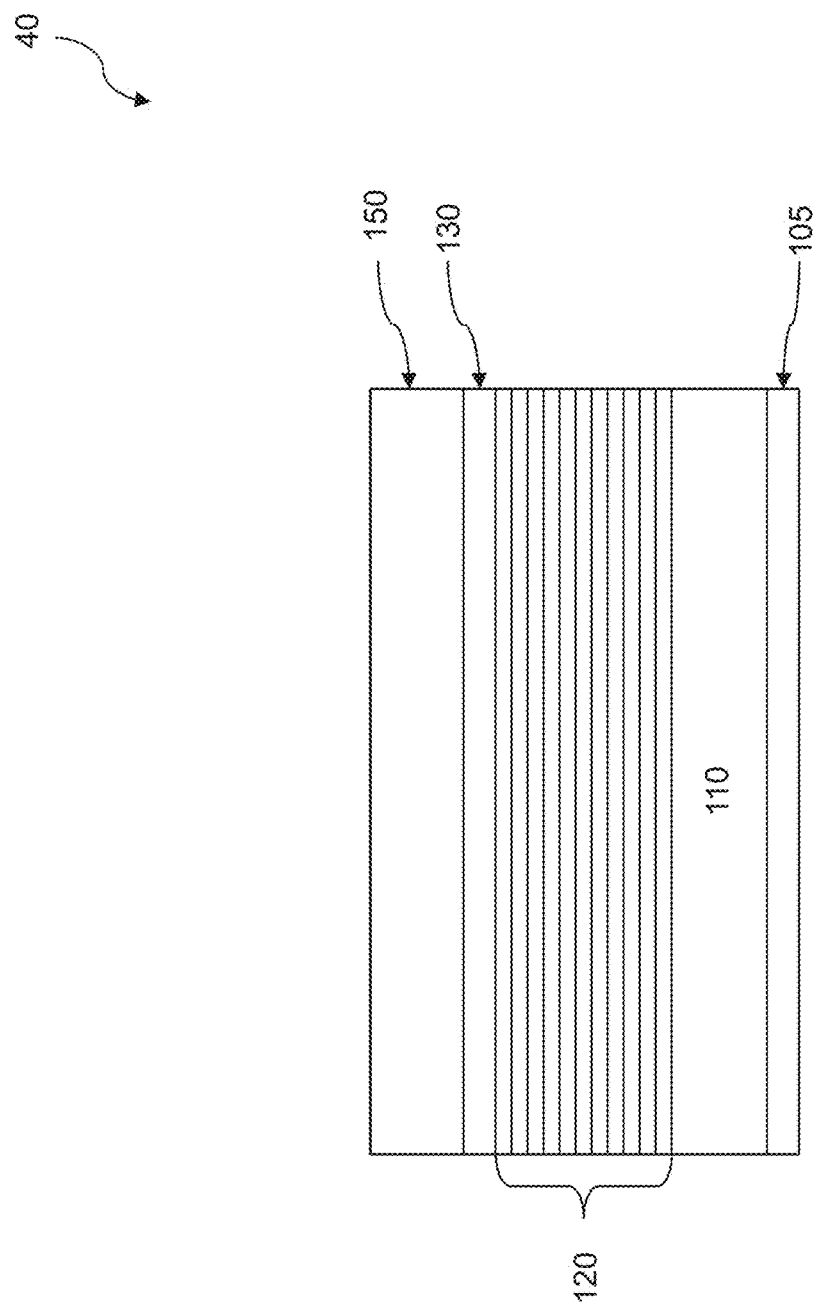
FIGS. 3 and 6 are diagrammatic cross-sectional views of a EUV mask at various fabrication stages constructed according to aspects of the present disclosure in one or more embodiment.
Figure 4:
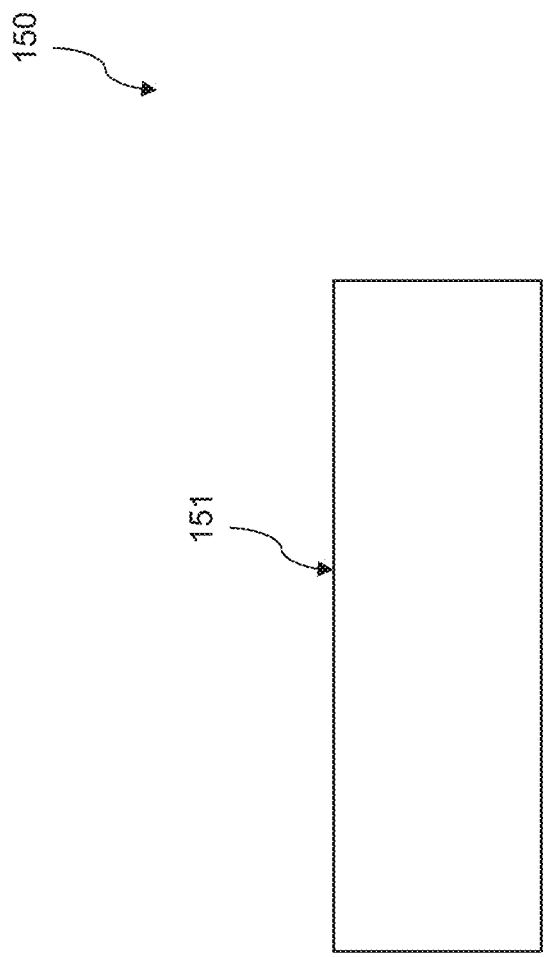
FIG. 4 is a diagrammatic cross-sectional view of the EUV mask (in portion) of FIG. 3 constructed according to aspects of the present disclosure in one embodiment.

FIGS. 3 and 4 are sectional views of the mask 40 at various fabrication stages constructed according to aspects of the present disclosure according to various embodiments. The Mask 40 and the method making the same are collectively described with reference to FIGS. 3-4 and other figures.

Referring to FIG. 3, the mask 40 at this stage is a blank EUV mask that includes a substrate 110 made of low thermal expansion material (LTEM). The LTEM material may include TiO2 doped SiO2, or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be disposed on back surface of the LTEM substrate 110 for the electrostatic chucking purpose. In an embodiment, the conductive layer 105 includes chromium nitride (CrN), though other compositions are possible.

A reflective multilayer (ML) 120 is deposited over the LTEM substrate 110 on the front surface. The ML 120 is also referred to as a first reflective layer 130, to avoid confusion when another reflective layer is introduced later. According to Fresnel equations, light reflection will occur when light propagates across the interface between two materials of different refractive indices. The reflected light is larger when the difference of refractive indices is larger. To increase the reflected light, one may also increase the number of interfaces by depositing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type/wavelength. A typical number of film pairs ranges from 20 to 80, however any number of film pairs is possible. In an embodiment, the ML 120 includes forty pairs of layers of Mo/Si. Each Mo/Si film pair has a thickness of about 7 nm, with a total thickness of 280 nm. In this case, a reflectivity of about 70% is achieved.

A buffer layer 130 may be formed above the ML 120 for one or more functions. In one example, the buffer layer 130 functions as an etch stop layer in a patterning process or other operations, such as repairing or cleaning. In another example, the buffer layer 130 functions to prevent oxidation of the ML 120. The buffer layer 130 may include one or more films to achieve the intended functions. In the present embodiment, the buffer layer 130 has different etching characteristics from a second reflective layer 150, which will be described later. In one example, the buffer layer 130 includes ruthenium (Ru). In furtherance of the example, the buffer layer 130 includes a Ru film with a thickness ranging between 2-5 nm. In other examples, the buffer layer 130 may include Ru compounds such as RuB, RuSi, chromium (Cr), Cr oxide, or Cr nitride. A low temperature deposition process is often chosen to form the buffer layer to prevent inter-diffusion of the ML 120.

In particular, the mask 40 includes the second reflective layer 150 formed over the first reflective layer 120. In the embodiment where the buffer layer 130 is present, the second reflective layer 150 is formed over the buffer layer 130, as illustrated in FIG. 3. The second reflective layer 150 is to be patterned according to an IC layout. The second reflective layer is designed to generate a 180° phase shift in the reflection coefficient (with respect to the region where the second reflective layer is removed after patterning) so that a phase-shifting mask for EUVL can be realized. Here, the relative reflection coefficient of a first region with respect to a second region is defined as the ratio of the amplitudes (complex numbers, including information of phases, evaluated at the same vertical height from a common mask surface, e.g., the mask bottom surface) of light reflected from the first region and the second region with the same incident light.

When the reflection coefficient can be −1 ("1" standing for no attenuation and "−" standing for 180° phase shift), then the mask 40 is an alternating phase-shifting mask (Alt-PSM), in which case there is no 0-th diffraction order, if the line-to-space area ratio of the IC layout is 1:1, and the highest aerial image contrast can be achieved. However, if the required thickness of the second reflective layer is too large, there arises the mask shadowing effect, which in turn degrades aerial image contrast. Therefore, the design of the second reflective layer needs to compromise between the reflection coefficient and thickness. In the present embodiment, the highest aerial image contrast can always be achieved since the 0-th diffraction order is removed by a pupil filter. However, if the reflection coefficient can be close to −1, then the amplitude of the 0-th diffraction order can be close to 0 and the exposure dose loss due to removal of the 0-th diffraction order can be minimized and the throughput of the exposure tool can be maximized. More, if the required thickness of the second reflective layer to achieve a 180° phase shift can be smaller, light scattering due to mask topography can be reduced and the throughput of the exposure tool can be further enhanced due to increase of the strength of the 1-st diffraction order. In the EUV wavelength range, every material is highly absorptive. It is difficult to achieve a reflection coefficient close to −1 using a single material for the second reflective layer. In EUVL, a multilayer of alternating materials is used to achieve a high reflectivity. Note that the reflectivity is defined as the absolute value squared of the reflection coefficient.

For EUVL using an imaging wavelength at 13.5 nm, Si and Mo are the best choice since they give the largest integrated reflectivity over the spectral range around 13.5 nm. The classic ML design consists of Si/Mo pairs with about 4-nm Si on about 3-nm Mo in each pair. When this classic ML design is employed for the second reflective layer to realize a phase-shifting mask, each Si/Mo pair contributes a phase shift of about 12°. Thus, to achieve a 180° phase shift, we need 15 Si/Mo pairs, with a total thickness of about 105 nm, in which case the mask shadowing effect should be prominent. Since the refractive index and the extinction coefficient of Si are close to 1 and 0, respectively, Si contributes little to the phase shift (with reference to light propagating in air). Almost the entire phase shift is due to the presence of Mo. The role Si plays is just to generate more Si/Mo interfaces, where reflection of light takes place. Thus, the total thickness of Mo should be close to 44 nm, no matter what design are adopted for the second reflective layer. In the classic ML design, the phase difference of light reflected from adjacent Si/Mo pairs is 360° (the minimum value since only integer multiple of 360° is acceptable to achieve high reflectivity), in which case every 3-nm Mo is accompanied by 4-nm Si, resulting in a large film stack height. However, if we allow the phase difference of light reflected from adjacent Si/Mo pairs to be 720°, then it is no need to insert so many Si layers and the total thickness required to generate a 180° phase shift for the second reflective layer can thus be reduced.

In the first embodiment, the second reflective layer 150 includes single molybdenum (Mo) film 151 with a thickness of about 44 nm, as illustrated in FIG. 4. According to the reason mentioned in the previous section, this should be the thinnest design of the second reflective layer if Mo is used. In this embodiment, the reflection coefficient is about −0.7757 and the reflectivity is about 0.6017.

Figure 5:
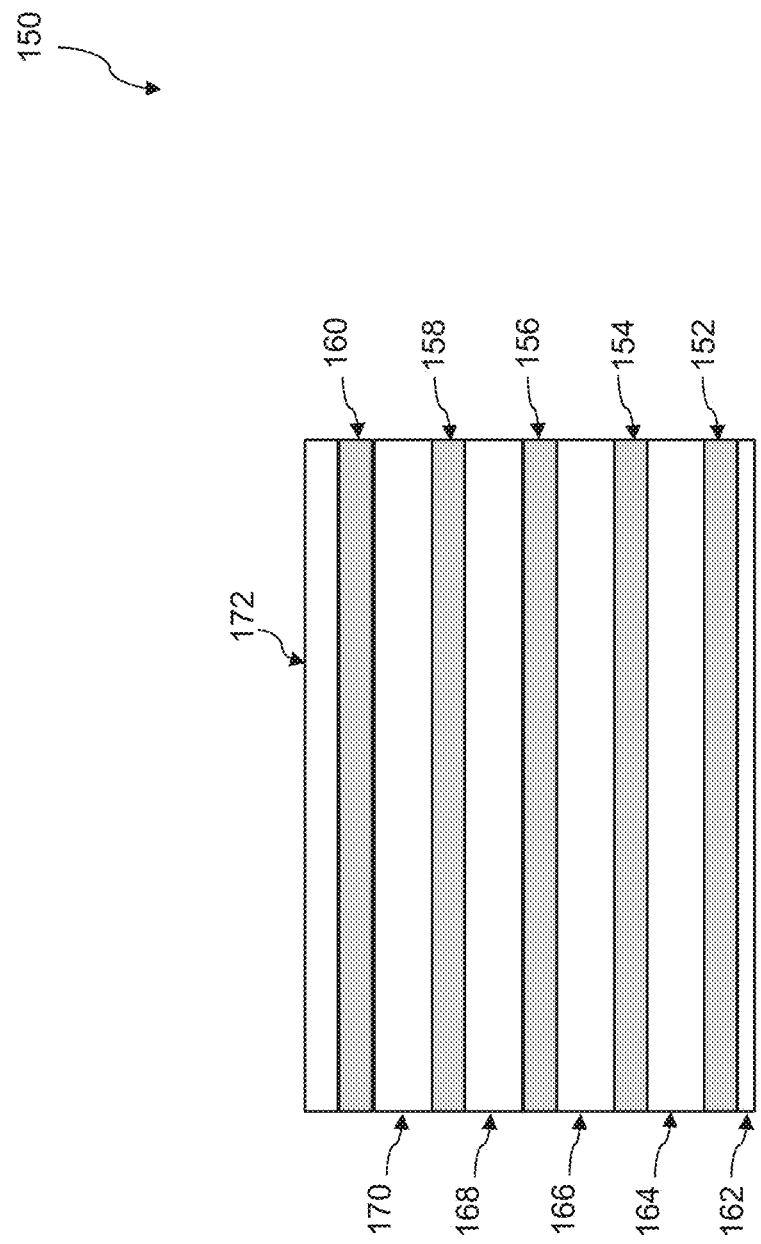
FIG. 5 is a diagrammatic cross-sectional view of the EUV mask (in portion) of FIG. 3 constructed according to aspects of the present disclosure in another embodiment.

In the second embodiment, the second reflective layer 150 includes multiple films, as illustrated in FIG. 5 as a cross-sectional view. Particularly, the second reflective layer 150 includes five Mo films 152, 153, 154, 155, and 156 as well as five Si films 162, 163, 164, 165, and 166 configured such that two adjacent Mo films sandwich a Si film and two adjacent Si films sandwich a Mo film. In the present embodiment, the Mo film 152 has a thickness of about 1 nm; the Mo films 153, 154, 155, and 156 have a same thickness of about 10.1 nm; the Si film 162 has a thickness of about 4 nm; the Si films 163, 164, and 165 have a same thickness of about 4.3 nm; the top Si film 166 has a thickness of about 2.6 nm. The second reflective layer 150 may further include another buffer layer 170 deposited on the top silicon film 166. In this embodiment, the reflection coefficient is about −0.8665 and the reflectivity is about 0.7508. In this embodiment, the total thickness of the second reflective layer is about 63.4 nm, much smaller than 105 nm. Compared with the first embodiment, though the total thickness of the second reflective layer is larger by about 19.4 nm, the reflectivity is about 55.7% higher.

In either the first or second embodiment, each of the thickness is within 20% of its respective nominal value. State differently, each thickness is in a range from 80% to 120% of its respective nominal value.

The buffer layer 172 is similar to the buffer layer 130. For example, the buffer layer 172 includes a Ru film. In furtherance of the example, the buffer layer 172 includes a Ru film with a thickness ranging from about 2 nm to about 5 nm. In other examples, the buffer layer 172 may include Ru compounds such as ruthenium boron (RuB), ruthenium silicon (RuSi), chromium (Cr), Cr oxide, or Cr nitride.

Referring back to FIG. 3, one or more of the layers 105, 120, 130, and 150 (such as 151 in FIG. 1 or 152-170 in FIG. 5) may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figure 6:
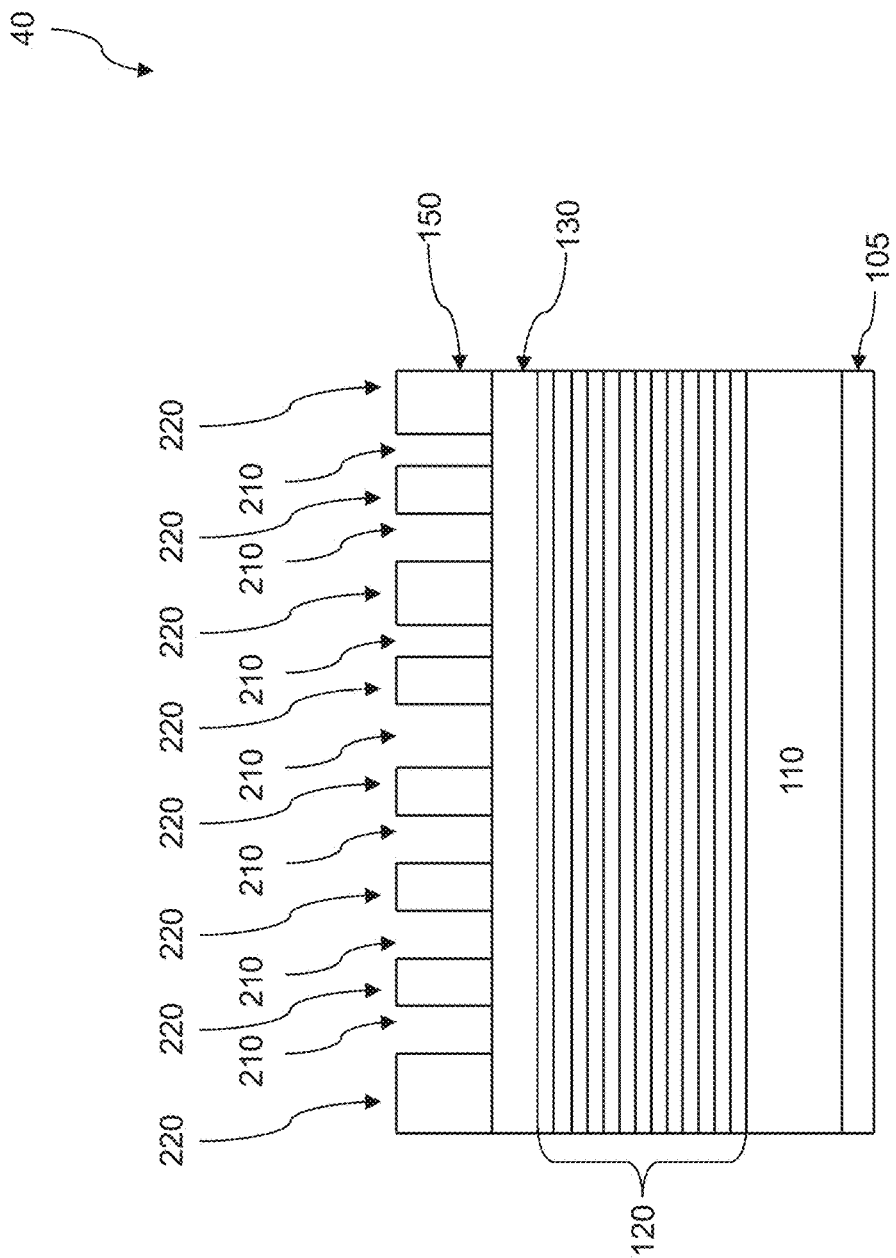

Referring to FIG. 6, in one of the present embodiments, the second reflective layer 150 is patterned to form a mask with two states. The second reflective layer 150 is patterned to form a state 210 and a state 220 by a mask patterning process. The mask patterning process may include resist coating (e.g., spin-on coating), soft baking, mask aligning, exposure, post-exposure baking, developing, rinsing, drying (e.g., hard baking), other suitable processes, and/or combinations thereof to form a patterned resist layer. Electron, ion, or photon beam direct writing can be used for the exposure step in the mask patterning process.

In the patterning process of the previous section, an etching process is used subsequently to remove portions of the second reflective layer 150 with the patterned resist layer as an etching mask. The etching process may include dry (plasma) etching, wet etching, and/or other etching methods. For the state 210, the second reflective layer is removed. For the state 220, the second reflective remains.

Still referring to FIG. 6, now the EUV mask 40 includes two states, 210 and 220. The reflection coefficients of state 210 and state 220 are r1 and r2, respectively. The two states are configured such that the absolute value of r2 is substantially equal or close to the absolute value of r1. Besides, in the present embodiment, the reflected EUV light from a region with the state 210 and the reflected EUV light from a region with the state 220 have an 180° phase difference.

FIG. 7 is a top view of the mask 40 constructed according to aspects of the present disclosure in one embodiment. Removing the 0th diffraction order (in the frequency space) leads to spatial frequency doubling (in the real space). Hence, we need to do spatial frequency halving on the mask 40 to obtain the desired IC patterns on the target 60. This can be achieved by a mask with three states, i.e., three different reflection coefficients, and by assigning different states to adjacent main polygons (for IC patterns) and the background (i.e., the region without main polygons). There are already two states, i.e., the states 210 and 220. In the present embodiment, a third state for the background is created by implementing sub-resolution assist polygons in the background and assigning a same state (e.g., the state 220) to all the sub-resolution assist polygons. Note that the background is defined as the regions without main polygons and the field is defined as the regions without main polygons and assist polygons. The field and the sub-resolution assist polygons collectively define the background. The field is then associated with another state (e.g., the state 210) different from that assigned to the assist polygons. The sub-resolution assist polygons are not printable during a lithography exposing process. At least one edge of the sub-resolution assist polygon is shorter than λ/NA, where λ is a wavelength of a radiation source and NA is a numerical aperture of the POB. Since the sub-resolution assist polygons are not printable, the background collectively has an effective reflection coefficient different from those of the first and second states (210 and 220). Hence, the effective reflection coefficient of the background is the area weighted average of the reflection coefficients of various regions (the sub-resolution assist polygons and the field) in the background.

Thus, as illustrated in FIG. 7, the mask 40 has 3 different states. The adjacent main polygons 310 and 320 are assigned to different states (such as states 210 and 220 respectively). In the background, field 330 and the sub-resolution assist polygons 340 are assigned to different states (such as states 210 and 220 respectively), thereby generating the background with the third mask state different from the first and second mask states (210 and 220). Since the sub-resolution assist polygons 340 are not printable, the background has an effective reflection coefficient different from those of the first and second states but is tunable by the pattern density of the sub-resolution assist polygons 340 in the background.

During a lithography exposing process, the mask 40 is exposed by a nearly on-axis illumination (ONI) with partial coherence σ less than 0.3 to produce diffracted lights and non-diffracted lights, removing most of the non-diffracted lights, collecting and directing the diffracted lights and the not removed non-diffracted lights by a projection optics box (POB) to expose a target.

In the present embodiment, the mask 40 is designed as a phase-shifting mask, such as alternating phase-shifting mask (AltPSM) for the EUV lithography process 10. The mask 40 includes a plurality of main polygons (for IC patterns) and assist polygons. Adjacent main polygons are assigned different states. For example, various main polygons 310 and 320 are assigned states 210 and 220, respectively. The sub-resolution assist polygons are not imaged to the target 60 (such as a wafer) during the EUV lithography process 10. However, they change the (effective) reflection coefficient of the background. In the present embodiment, the pattern density in the background is substantially uniform. The pattern density in the background is defined as the total area of assist polygons in a unit area. The (effective) reflection coefficient of the background can be tuned by varying the pattern density in the background. Main polygons and assist polygons are formed by patterning the second reflective layer 150.

Furthermore, the second reflective layer 150 is designed such that the reflected EUV light from the state 210 and the reflected EUV light from the state 220 have a 180° phase difference. In this case, the amplitude of the 0-th diffraction order (proportional to the area weighted reflection coefficients of various regions, including main polygons, assist polygons, and the field, on the mask 40) can be zero by tuning the pattern density. For example, when r2=−r1 and the pattern density is 50%, the amplitude of the 0-th diffraction order is 0. Therefore, the exposure dose loss by removal of the 0-th diffraction order is minimized and the throughput of the exposure tool is maximized.

The second reflective layer 150 determines the reflection coefficient of the state 220 relative to that of the state 210. In the first embodiment associated with FIG. 4, the (relative) reflection coefficient is about −0.7757. In the second embodiment associated with FIG. 5, the (relative) reflection coefficient is about −0.8665. Here, the "−" sign stands for a 180° phase difference.

Various advantages may present in different embodiments of the present disclosure. For example, the mask 40 is designed as an alternating phase shift mask, the imaging quality, contrast and resolution are improved. The mask 40 does not suffer pattern imbalance issue, comparing with the conventional alternating phase shift mask. In one embodiment, since the amplitude A is substantially close to 1 (0.776 in the first embodiment associated with FIG. 4 and 0.867 in the second embodiment associated with FIG. 5), the overall radiation energy loss is substantially low, about 40% or less. Accordingly, the exposing duration of the lithography exposing process is reduced and the throughput is increased. In various embodiments, the thickness of the patterned layer (the second reflective layer 150) of the mask 40 is reduced to below 90 nm, and the shadow effect during the exposing process is reduced or eliminated. Since no absorption layer is used or a less attenuating material is used to form a patterned layer 150, the radiation energy loss is reduced. In another example, the mask 40 in FIG. 7 may be designed differently such that the sub-resolution assist polygons 340 are in the first state 210 and the field 330 is in the second state 220.

FIG. 8 is a flowchart of a method 350 for making a mask. The method 350 is described with reference to FIGS. 7 and 8. The method 350 includes an operation 352 by receiving an IC pattern having a plurality of IC features (also referred to as main polygons), such as doped features, fin-like active regions, gates, or metal lines.

The method 350 includes an operation 354 by assigning various main polygons to two states (first state and second state) such that adjacent main polygons are assigned to different states. The first state has a first reflectivity and the second state has a second reflectivity. In various examples, the second reflectivity is greater than 50% of the first reflectivity or alternatively the first reflectivity is greater than 50% of the second reflectivity. In FIG. 7, the main polygons 310 and 320 are assigned with the states 210 and 220, respectively.

The method 350 includes an operation 356 by incorporating sub-resolution polygons in the background, thereby assigning the field and the sub-resolution polygons with different states, such as the first state 210 and the second state 220, respectively or vise verse. In FIG. 7, the field 330 is assigned with the state 210 and the sub-resolution polygons 340 are assigned to the state 220. The pattern density of the sub-resolution polygons 340 in the background is designed such that the background is tuned to have an expected state, which is different from the states 210 and 220 in term of reflection coefficients.

The method 350 includes an operation 358 by forming tape-out data for mask fabrication based on the IC pattern that includes the plurality of main polygons with the respective assigned states (210 or 220) and the background with sub-resolution polygons. The tape-out data defines the IC pattern and is prepared in a proper format for mask making. The method 350 may include other operations prior to the operation 358. For example, the method 350 may include fracturing, optical proximity correction (OPC), simulation, design rule check, and/or mask rule check. In one example, the OPC process incorporates various assist polygons to the IC pattern. In furtherance of the example, the assist polygons are assigned with a same state, such as the second state 220.

The method 350 may include an operation 360 to fabricate a mask 40 based on the tape-out data. The fabrication of the mask 40 is described above in FIGS. 3-6. For example, the fabrication of the mask includes forming the first reflective layer 120 and forming the second reflective layer 150. The fabrication of the mask further includes patterning the second reflective layer 150 according to the tape-out data to form various features in state 210 or state 220, respectively.

The method 350 may include an operation 362 to fabricate a wafer using the mask. The fabrication of the wafer includes performing a lithography process to the wafer using the mask 40. The operation 362 is further described in the method 362, as illustrated in FIG. 9 as a flowchart.

The method 362 may include an operation 372 by loading the mask 40 to a lithography system, such as the lithography system 10 (in FIG. 1) that is operable to perform a EUV lithography exposing process. The mask includes multiple states 210 and 220. Particularly, different states are assigned to adjacent main polygons. The sub-resolution polygons and the field are assigned with different states.

The method 362 may include an operation 374 by loading the target 60 to the lithography system 10. The target 60, such as a wafer, is coated with a resist layer. In the present embodiment, the resist layer is sensitive to the EUV radiation from the radiation source 20 of the lithography system 10.

The method 362 includes an operation 376 by performing a lithography exposing process to the target in the lithography system 10. The lithography exposing process uses the mask 40, thereby the mask pattern defined on the mask 40 being imaged to the resist layer. In the present embodiment, the lithography exposing process of the operation 376 is implemented in a mode such that the non-diffracted lights are removed. Particularly, the lithography exposing process includes exposing the mask 40 by a nearly on-axis illumination (ONI) with partial coherence σ less than 0.3 to produce diffracted lights and non-diffracted lights, removing most of the non-diffracted lights, collecting and directing the diffracted lights and the not removed non-diffracted lights by a projection optics box (POB) to expose the target.

The method 362 may include an operation 378 by developing the exposed resist layer to form a resist pattern having a plurality of openings defined thereon. The method 362 may further include other operations, such as an operation 380 to perform a fabrication process to the wafer through the openings of the resist pattern. In one example, the fabrication process includes an etch process to the wafer using the resist pattern as an etch mask. In another example, the fabrication process includes an ion implantation process to the wafer using the resist pattern as an implantation mask.

The present disclosure is directed towards lithography systems and processes. In one embodiment, an extreme ultraviolet lithography (EUVL) process includes receiving an EUV mask with multiple states, wherein different states of the EUV mask are assigned to adjacent main polygons, and incorporating sub-resolution polygons in the background such that the field and the sub-resolution polygons are assigned with different states, and exposing the EUV mask by a nearly on-axis illumination with partial coherence σ less than 0.3 to produce diffracted lights and non-diffracted lights, removing most of the non-diffracted lights, collecting and directing the diffracted lights and the not removed non-diffracted lights by a projection optics box (POB) to expose a target.

In another embodiment, an EUVL process includes forming an EUV mask with two states, assigning different states of the EUV mask to adjacent main polygons and different states to the field and the sub-resolution polygons, exposing the EUV mask by nearly an on-axis illumination with partial coherence σ less than 0.3 to produce diffracted lights and non-diffracted lights, removing the non-diffracted lights, and collecting and directing the diffracted lights and the not removed non-diffracted lights by a POB to expose a semiconductor wafer.

The present disclosure is also directed towards masks. In one embodiment, a EUV mask includes a low thermal expansion material (LTEM) substrate, a reflective ML (the first reflective layer) above one surface of the LTEM substrate, and a conductive layer above an opposite surface of the LTEM substrate. A buffer layer is provided above the reflective ML, and a second reflective layer is provided above the buffer layer. A patterning process is performed on the second reflective layer to form multiple states, which are assigned to different main polygons, field and sub-resolution polygons.

Based on the above, it can be seen that the present disclosure offers the EUV lithography process 362. The EUV lithography process employs a nearly ONI, e.g., a disk illumination with partial coherence σ smaller than 0.3 to expose a EUV mask to produce diffracted lights and non-diffracted lights. The EUV lithography process 362 removes the non-diffracted lights and utilizes mainly the diffracted lights from two symmetrically located (on the pupil plane) and intensity balanced −1-st and +1-st diffraction orders to expose a semiconductor wafer. The EUV lithography process also employs a EUV mask with two states with pre-specified reflection coefficients. Different states are assigned to adjacent main polygons, field and sub-resolution polygons. The EUV lithography process demonstrates an enhancement of aerial image contrast for both line/space and end-end patterns, and achieves a high depth of focus (DOF) in a large pitch range. The EUV lithography process provides a resolution enhancement technique for advanced technology nodes.

Other alternatives or embodiments may present without departure from the spirit and scope of the present disclosure. In one example, one or more of the operations 352 through 358 in the method 350 are implemented by a computer, such as a computer-aided IC design system.

Thus, the present disclosure provides a mask for extreme ultraviolet lithography (EUVL) in accordance with some embodiments. The mask includes a first state and a second state different from each other; a first main polygon and a second main polygon adjacent to the first main polygon; a plurality of sub-resolution assist polygons; and a field. Each of the first and second main polygons, the sub-resolution assist polygons, and the field has an associated state. The state assigned to the first main polygon is different from the state assigned to the second main polygon. The plurality of assist polygons are assigned a same state, which is different from a state assigned to the field.

The present disclosure provides an extreme ultraviolet (EUVL) process for patterning a target, in accordance with some embodiments. The EUVL process includes receiving a mask. The mask includes a first state and a second state different from the first state; a first main polygon and a second main polygon adjacent to the first main polygon; a plurality of sub-resolution assist polygons; and a field. The state assigned to the first main polygon is different from the state assigned to the second main polygon. The plurality of assist polygons are assigned a same state, which is different from a state assigned to the field. The EUVL process further includes exposing the mask by a nearly on-axis illumination (ONI) with partial coherence σ less than 0.3 to expose the mask to produce diffracted light and non-diffracted light; removing most of the non-diffracted light by a filter; and collecting and directing the diffracted light and the not removed non-diffracted light by a projection optics box (POB) to expose the target.

The present disclosure provides one embodiment of an extreme ultraviolet lithography (EUVL) process, in accordance with some embodiments. The EUVL process includes receiving an extreme ultraviolet (EUV) mask with multiple states. The EUV mask includes a first main polygon of a first state; a second main polygon adjacent to the first main polygon, wherein the second main polygon has a second state different from the first state; a first plurality of assist polygons with the first state and a field with the second state. The EUVL process further includes exposing the EUV mask by a nearly on-axis illumination (ONI) with partial coherence σ less than 0.3 to produce diffracted lights and non-diffracted lights; removing most of the non-diffracted lights;

and collecting and directing the diffracted lights and the not removed non-diffracted lights by a projection optics box (POB) to expose a target.

The present disclosure provides an extreme ultraviolet lithography (EUVL) process for patterning a target in accordance with some embodiments. The EUVL process includes receiving a mask that further includes a first state and a second state different from the first state; a first main polygon and a second main polygon adjacent to the first main polygon; a plurality of sub-resolution assist polygons; and a field. Each of the main polygons, the assist polygons, and the field has an associated state. The state assigned to the first main polygon is different from the state assigned to the second main polygon. The plurality of assist polygons are assigned a same state, which is different from a state assigned to the field. The EUVL process further includes exposing the mask by an illumination to produce diffracted light and non-diffracted light; removing most of the non-diffracted light by a filter; and collecting and directing the diffracted light and the not removed non-diffracted light by a projection optics box (POB) to expose the target.

In some examples, the illumination is off-axis and consists of sources with partial coherence σ between $\sigma_c - \Delta\sigma/2$ and $\sigma_c + \Delta\sigma/2$, wherein $\sigma_c$ is about 0.5 and $\Delta\sigma$ is less than 0.3.

The present disclosure provides an extreme ultraviolet (EUV) mask in accordance with some embodiments. The EUV mask includes a low thermal expansion material (LTEM) substrate; a first reflective layer above one surface of the LTEM substrate; a buffer layer above the first reflective layer; and a second reflective layer above the buffer layer, wherein the second reflective layer is patterned to have various openings and defines a first state and a second state. The first state includes the first reflective layer and is free of the second reflective layer. The second state includes both the first and second reflective layers. Adjacent main polygons are defined in the first and second states, respectively. A plurality of sub-resolution assist polygons is defined in one of the first state and the second state. A field is defined in another of the first state and the second state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) mask, comprising:
   a substrate;
   a first reflective layer above a surface of the substrate; and
   a second reflective layer over the first reflective layer, wherein the second reflective layer has various openings that define a first state and a second state,
   wherein the first state includes the first reflective layer and is free of the second reflective layer, and the second state includes both the first and second reflective layers,
   wherein the first state has a first reflection coefficient and a first reflectivity, the second state has a second reflection coefficient and a second reflectivity, and a phase difference between the first and second reflection coefficients is about 180 degrees.

2. The EUV mask of claim 1, further comprising:
   a buffer layer between the first and second reflective layers.

3. The EUV mask of claim 1, wherein the second reflective layer has a total thickness less than 90 nanometers (nm).

4. The EUV mask of claim 1, wherein the second reflective layer is a single molybdenum (Mo) film.

5. The EUV mask of claim 4, wherein the single Mo film has a thickness ranging between 35.2 nm and 52.8 nm.

6. The EUV mask of claim 1, wherein the second reflective layer comprises pairs of alternating Si and Mo films with a total thickness less than 90 nm.

7. The EUV mask of claim 6, wherein each pair of the Si and Mo film introduces a phase shift that is two or more multiples of 360 degrees.

8. The EUV mask of claim 6, wherein a total thickness of the Mo films is about 44 nm (nominal).

9. The EUV mask of claim 1, wherein the second reflectivity is greater than 50% of the first reflectivity.

10. An extreme ultraviolet (EUV) mask, comprising:
    a low thermal expansion material (LTEM) substrate;
    a first reflective layer above a surface of the LTEM substrate; and
    a second reflective layer over the first reflective layer, wherein the second reflective layer has various openings that define a first state and a second state,
    wherein the first state includes the first reflective layer and is free of the second reflective layer, and the second state includes both the first and second reflective layers,
    wherein the first state has a first reflection coefficient and a first reflectivity, the second state has a second reflection coefficient and a second reflectivity, a phase difference between the first and second reflection coefficients is about 180 degrees, and the second reflectivity is greater than 50% of the first reflectivity.

11. The EUV mask of claim 10, further comprising:
    a buffer layer directly over the first reflective layer, wherein the second reflective layer is directly over the buffer layer.

12. The EUV mask of claim 11, wherein the buffer layer includes a ruthenium compound, ruthenium silicon, chromium, chromium oxide, or chromium nitride.

13. The EUV mask of claim 10, wherein the second reflective layer comprises pairs of alternating Si and Mo films with a total thickness less than 90 nm.

14. The EUV mask of claim 13, wherein a total thickness of the Mo films in the second reflective layer is about 44 nm (nominal).

15. The EUV mask of claim 13, wherein at least some pairs of the Si and Mo films introduce a 720-degree phase shift per pair to a EUV light.

16. The EUV mask of claim 13, wherein the second reflective layer includes:
    a first Mo film with a thickness of about 1 nm;
    a first Si film over the first Mo film and with a thickness of about 4 nm;
    a second Mo film over the first Si film and with a thickness of about 10.1 nm;
    a second Si film over the second Mo film and with a thickness of about 4.3 nm;
    a third Mo film over the second Si film and with a thickness of about 10.1 nm;
    a third Si film over the third Mo film and with a thickness of about 4.3 nm;
    a fourth Mo film over the third Si film and with a thickness of about 10.1 nm;

a fourth Si film over the fourth Mo film and with a thickness of about 4.3 nm;
a fifth Mo film over the fourth Si film and with a thickness of about 10.1 nm; and
a fifth Si film over the fifth Mo film and with a thickness of about 2.6 nm.

17. An extreme ultraviolet (EUV) mask, comprising:
a low thermal expansion material (LTEM) substrate;
a first reflective layer above a surface of the LTEM substrate;
a buffer layer above the first reflective layer; and
a second reflective layer above the buffer layer, wherein the second reflective layer has various openings that define a first state and a second state, wherein the first state includes the first reflective layer and is free of the second reflective layer, and the second state includes both the first and second reflective layers,
wherein the first state has a first reflection coefficient and a first reflectivity, the second state has a second reflection coefficient and a second reflectivity, a phase difference between the first and second reflection coefficients is about 180 degrees, and the second reflectivity is greater than 50% of the first reflectivity.

18. The EUV mask of claim 17, wherein the first reflective layer includes forty pairs of alternating Mo and Si films, and the second reflective layer includes five pairs of alternating Si and Mo films.

19. The EUV mask of claim 17, wherein the first reflective layer includes pairs of alternating Mo/Si or Mo/Be films, and the second reflective layer includes a single Mo film having a thickness about 44 nm (nominal).

20. The EUV mask of claim 17, wherein the second reflective layer includes pairs of alternating Si and Mo films, wherein a phase difference of a EUV light reflected from adjacent Si/Mo pairs is 720°.

* * * * *